July 2, 1929. W. G. CADY Re. 17,357

PIEZO ELECTRIC RESONATOR

Original Filed Jan. 28, 1920

INVENTOR
WALTER G. CADY
by David Rines
ATTORNEY

Reissued July 2, 1929. Re. 17,357

UNITED STATES PATENT OFFICE.

WALTER G. CADY, OF MIDDLETOWN, CONNECTICUT, ASSIGNOR TO RADIO CORPORATION OF AMERICA, A CORPORATION OF DELAWARE.

PIEZO-ELECTRIC RESONATOR.

Original No. 1,450,246, dated April 3, 1923, Serial No. 354,659, filed January 28, 1920. Application for reissue filed August 6, 1925. Serial No. 48,679.

DIVISION C.

The present invention relates to electro-mechanical vibrators, and more particularly to piezo-electric vibrators.

Figure 1:
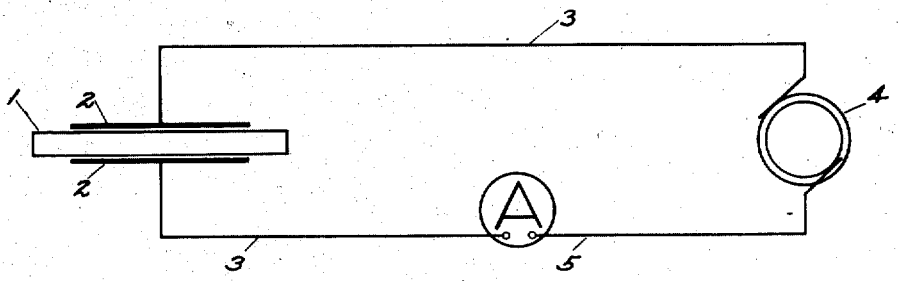
Figure 2:
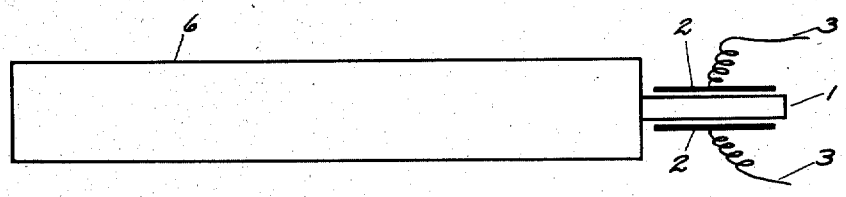

The nature and the objects of the invention will be explained in connection with the accompanying drawings, in which Fig. 1 is a diagrammatic view of a circuit and apparatus illustrating the principles underlying the present invention; and Fig. 2 is a view illustrating one form of the invention.

For many years it has been known that quartz, tourmaline and certain other crystals, if compressed or otherwise strained in certain directions, respond electrically, so as to exhibit positive and negative electrification in certain regions on their surfaces. It has also been known that the converse effect obtains, that is to say, that such crystals, when electrically stimulated, as by being placed in an electric field, become deformed. This phenomenon has been known as piezo-electricity. In the specification and the claims, the action of the electric forces to cause mechanical deformation will, for brevity, be called "stimulation"; and the development of the electromotive force by the deformation will be called "response". A large number of both natural and artificial crystals have been found to possess this piezo-electric property. The general knowledge on the subject has so far developed that it is now possible to predict in advance wheather a given crystal will show the piezo-electric effect, and in what manner a plate or rod should be cut from the crystal in order to exhibit this effect to the greatest possible degree.

The crystal that has been most commonly employed in piezo-electric experiments, in the past, has been quartz. As a rule, investigators have used thin, flat plates or rods 1 of quartz rectangular in cross section, and coated on their opposite faces with tinfoil coatings 2, Fig. 1.

As is explained in my application, Serial No. 20,277, filed April 2, 1925, for reissue of my Letters Patent No 1,450,246, of which my present application is a division, a plate or rod 1 Fig. 1 suitably cut from a piezo-electric crystal according to approved practice, and provided with conductive coatings 2 that are connected with a source of high-frequency current 4 by conductors 3, as shown in Fig. 1, becomes set into vibration at various frequencies of the alternating current. The amplitude of such forced vibrations is exceedingly minute, except when the frequency of the current approximates a natural frequency of mechanical vibration of the plate. Even at this natural frequency, the changes in the dimensions of the plate resulting from its forced vibrations are so minute as to escape detection under ordinary conditions. They are nevertheless sufficient to exert a marked reaction upon the electric current. At approximately the critical frequency, the absorption of energy in the plate causes the current in the circuit to pass through a minimum. If the frequency of the current be increased, for example, then the current traversing the circuit, as measured by an ammeter 5 in series with the coatings, will be found to pass through a maximum at a frequency slightly below the resonant frequency, followed by a minimum at a frequency slightly above the resonant frequency. If the frequency be decreased, this process will be reversed.

When the plate is made from a piezo-electric crystal of good elastic qualities, such as quartz, when its width is small in comparison with its length, and it is mounted in such manner that its vibrations will be damped as little as possible, the reaction is extremely sharp and very pronounced. Such a plate, connected to a source of electric oscillations of variable frequency, will respond when one and only one frequency—neglecting for the moment overtones—is being generated. It forms a piezo-electric resonator, somewhat analogous to the acoustical resonators Helmholtz.

It is not necessary that the device comprise a long, narrow plate, although this has its advantages in permitting greater sharpness of tuning, and in securing greater freedom from effects that might be produced by undesired modes of vibration. The plate may have various shapes, or some other form than a plate may be used, including the entire native crystal itself. In fact, it is within the scope of the present invention to use other electro-mechanical vibrators than piezo-electric crystals. The only essential condition is that the vibrator shall be mounted and connected to an oscillating circuit of variable frequency in such a manner as to react electrically upon such circuit at a particular frequency. In general, the more complicated the form, the more numerous are the frequencies to which the unit will respond.

When the desired frequency is relatively low, crystals of sufficient size may not be economically secured. According to the present invention, therefore, I use a thin rod 6 Fig. 2 of any solid substance of good, elastic properties, for example, steel, as the vibrating element. It should be of such length that its natural period of vibration, calculable from the well-known equation, is of the desired value. This rod is set into vibration by means of a piezo-electric plate 1 of relatively small dimensions, cemented or otherwise held in intimate contact with it. The shape, size and material of the plate 1 should be such as to excite as strong longitudinal vibrations in the rod 6 as possible, when the metallic coatings 2 are connected to a source of high-frequency electro-motive force, but, in any event, it should be small enough so that none of its own modes of vibration, to which it may be piezo-electrically excited, are of a frequency sufficiently near the natural frequency of the rod 6 to be troublesome. The natural frequency of the rod 6 is, of course, slightly modified by the plate 1 attached thereto, but the combination of the two forms a unit of very constant frequency, capable of reacting sharply on a high-frequency circuit in exactly the same manner as the plates when used alone, as in Fig. 1.

The rod 6 should be of such material that its natural frequency is as slightly as possible affected by changes of temperature, but, in any case, correction may readily be made for this. It need not be of solid material,—though solid materials will probably be found best,—for it is possible to use, in place of a solid, a column of liquid, for example, mercury, in a long narrow tube, one end of the column being in contact with the piezo-electric plate or crystal. One advantage of this arrangement is the possibility of varying the frequency of vibration at will, by adjustment of the length of the column of fluid.

The piezo-electric resonator may be used in various ways, as, for example, to produce a large impedance or reactance in an alternating circuit as a certain particular frequency or frequencies, to serve as a standard of frequency or wave length in high-frequency circuits, or, even, for such purposes as coupling one high-frequency circuit to another, in order to transmit energy from one to the other circuit as a certain particular frequency, as described in the above-designated application.

It will be understood that the invention is not restricted to the exact embodiments thereof that are illustrated and described herein, as other modifications will readily occur to persons skilled in the art, and all such are considered to fall within the spirit and scope of the invention, as defined in the appended claims.

What I claim as my invention is:

1. An electro-mechanical vibrator comprising a body adapted to vibrate mechanically when stimulated electrically and to respond electrically when vibrated mechanically, and an element having a natural period of vibration connected with the body, the parts being so designed that they shall vibrate as a unit at substantially the frequency of said natural period when the body is stimulated electrically.

2. An electro-mechanical vibrator comprising a piezo-electric body and an element having a natural period of vibration connected with the body, the parts being so designed that the body shall respond electrically when the parts are vibrated mechanically as a unit.

3. An electro-mechanical vibrator comprising a relatively long element and a relatively short body connected with the element, the body being adapted to vibrate mechanically when stimulated electrically, and the parts being so designed that the body shall excite vibrations in the element when the body is stimulated electrically.

4. An electro-mechanical vibrator comprising a relatively long element and a relatively short body connected with the element, the body being adapted to respond electrically when vibrated mechanically, and the parts being so designed that the body shall respond electrically when the element is vibrated mechanically.

5. An electro-mechanical vibrator comprising a relatively long element and a relatively short body connected with the element, the body being adapted to vibrate mechanically when stimulated electrically and to respond electrically when vibrated mechanically, and the parts being so designed that the body shall excite vibrations in the element when the body is stimulated electrically.

6. An electro-mechanical vibrator comprising a relatively long, thin elastic rod and a relatively small piezo-electric body connected with the rod, the body being adapted to vibrate mechanically when stimulated electrically and the parts being so designed that the body shall excite longitudinal vibrations in the rod when the body is stimulated electrically.

7. An electro-mechanical vibrator comprising a relatively long, thin, elastic rod and a relatively small piezo-electric body connected with the rod, the body being adapted to respond electrically when vibrated mechanically, and the parts being so designed that the body shall respond electrically when the element is vibrated mechanically.

8. An electro-mechanical vibrator comprising a relatively long, thin elastic rod and a relatively small piezo-electric body connected with the rod, the body being adapted to vibrate mechanically when stimulated electrically and to respond electrically when vibrated mechanically, and the parts being so designed that the body shall excite longitudinal vibrations in the rod when the body is stimulated electrically.

9. A vibrating system having, in combination, a mechanical vibrator having a predetermined natural period, and piezo-electric means for vibrating the same at a frequency substantially equal to the natural period of said vibrator.

In testimony whereof, I hereunto affix my signature.

WALTER G. CADY.

DISCLAIMER

Re. 17,357.—*Walter G. Cady*, Middletown, Conn. PIEZO-ELECTRIC RESONATOR. Patent dated July 2, 1929. Disclaimer filed April 10, 1933, by the assignee, *Radio Corporation of America.*

Hereby enters this disclaimer to the said claims of said Letters Patent which are in the following words, to wit:

"1. An electro-mechanical vibrator comprising a body adapted to vibrate mechanically when stimulated electrically and to respond electrically when vibrated mechanically, and an element having a natural period of vibration connected with the body, the parts being so designed that they shall vibrate as a unit at substantially the frequency of said natural period when the body is stimulated electrically.

"2. An electro-mechanical vibrator comprising a piezo-electric body and an element having a natural period of vibration connected with the body, the parts being so designed that the body shall respond electrically when the parts are vibrated mechanically as a unit."

[*Official Gazette May 9, 1933.*]

ing a relatively long, thin elastic rod and a relatively small piezo-electric body connected with the rod, the body being adapted to vibrate mechanically when stimulated electrically and to respond electrically when vibrated mechanically, and the parts being so designed that the body shall excite longitudinal vibrations in the rod when the body is stimulated electrically.

9. A vibrating system having, in combination, a mechanical vibrator having a predetermined natural period, and piezo-electric means for vibrating the same at a frequency substantially equal to the natural period of said vibrator.

In testimony whereof, I hereunto affix my signature.

WALTER G. CADY.

DISCLAIMER

Re. 17,357.—*Walter G. Cady*, Middletown, Conn. PIEZO-ELECTRIC RESONATOR. Patent dated July 2, 1929. Disclaimer filed April 10, 1933, by the assignee, *Radio Corporation of America.*

Hereby enters this disclaimer to the said claims of said Letters Patent which are in the following words, to wit:

"1. An electro-mechanical vibrator comprising a body adapted to vibrate mechanically when stimulated electrically and to respond electrically when vibrated mechanically, and an element having a natural period of vibration connected with the body, the parts being so designed that they shall vibrate as a unit at substantially the frequency of said natural period when the body is stimulated electrically.

"2. An electro-mechanical vibrator comprising a piezo-electric body and an element having a natural period of vibration connected with the body, the parts being so designed that the body shall respond electrically when the parts are vibrated mechanically as a unit."

[*Official Gazette May 9, 1933.*]